United States Patent [19]
Catagnus et al.

[11] 3,977,018
[45] Aug. 24, 1976

[54] PASSIVATION OF MERCURY CADMIUM TELLURIDE SEMICONDUCTOR SURFACES BY ANODIC OXIDATION

[75] Inventors: Philip C. Catagnus, Richardson; Charles T. Baker, Dallas, both of Tex.

[73] Assignee: Texas Instruments Incorporated, Dallas, Tex.

[22] Filed: July 16, 1975

[21] Appl. No.: 596,331

Related U.S. Application Data

[63] Continuation of Ser. No. 312,096, Dec. 4, 1972, abandoned.

[52] U.S. Cl. .................................. 357/30; 357/52; 357/61; 204/15; 204/56 R
[51] Int. Cl.² ................. H01L 27/14; H01L 29/34; H01L 29/161
[58] Field of Search ............... 357/30, 61, 52, 23; 204/56 R, 15

[56] References Cited
UNITED STATES PATENTS

| | | | |
|---|---|---|---|
| 3,577,175 | 5/1971 | Gri et al. | 317/237 |
| 3,723,190 | 3/1973 | Kruse | 148/1.5 |
| 3,779,803 | 12/1973 | Lee et al. | 117/211 |
| 3,798,135 | 3/1974 | Bracken | 204/15 |
| 3,799,803 | 3/1974 | Kraus et al. | 117/212 |
| 3,929,589 | 12/1975 | Ermanis | 204/15 |

*Primary Examiner*—Martin H. Edlow
*Attorney, Agent, or Firm*—Harold Levine; Rene' E. Grossman; Alva H. Bandy

[57] ABSTRACT

A substrate of photoconductive semiconductor material is anodized by electrolysis in an electrolyte such as, for example, 0.1M KOH 90% ethylene glycol - 10% deionized water to form anodic oxide surfaces to stabilize the surface state density to prevent recombination hole-electron pairs during sweepout thereby producing a long term, high temperature stable infrared detector.

9 Claims, 12 Drawing Figures

| COLOR CYCLES | COLOR | ANODIC THICKNESS |
|---|---|---|
| 1st ORDER | LIGHT GOLD<br>DEEP GOLD<br>BROWN<br>ORANGE<br>INDIGO<br>BLUE VIOLET<br>BLUE<br>LIGHT BLUE | TALLY-SURF ELLIPSOMETER<br><br>500°A TO 900°A |
| 2nd ORDER | LIGHT GREEN<br>GOLD<br>VIOLET<br>BLUE | 1200° A        906<br>1400° A |
| 3rd ORDER | GREEN<br>GREEN-GOLD<br>VIOLET | 1950        2129 |
| 4th ORDER | BLUE GREEN<br>PINK | 3950 A° |

PASSIVATION OF MERCURY CADMIUM TELLURIDE SEMICONDUCTOR SURFACES BY ANODIC OXIDATION

This is a continuation of application Ser. No. 312,096, filed Dec. 4, 1972, abandoned.

This invention relates to photoconductive type semiconductor devices and more particularly to semiconductor detectors for detecting infrared energy.

Photoconductive type semiconductor devices such as, for example, mercury, cadmium telluride detectors have required surface passivation to avoid contamination. Passivation has been accomplished by either depositing layers of chemical compounds such as, for example, zinc sulfide or silicon oxide on the device surfaces. Devices with these passivation layers were found to vary substantially in their performance of detecting infrared or light energy and also to degrade with time when subjected to temperatures over 70°C.

It was first believed that the varying performance, i.e., the inability to produce devices having substantially reproducible characteristics, stemmed from the use of poor grade reagents; however, the performance continued as before, even with the use of electronic grade reagents. Reliability tests including capacitance-voltage (CV) measurements on MOS devices made after device temperature cycling (temperatures of 70°–90°C) were used to determine the effect of density of surface states and surface potential on these devices. Response time measurements reveal that these devices' minority carrier lifetimes were dominated substantially by their surfaces. By correlating the response times of detectors with the bulk lifetime of the materials used to fabricate the detectors, it was found that the detector' effective lifetime, and hence their responsivity was inversely proportional to their surface recombination velocities. In fact bulk lifetimes of several microseconds are the result of essentially all carrier recombination taking place at the surface with the recombination velocity there setting the effective lifetime of carriers generated in the bulk. As the diffusion length of holes is substantially longer than the detector thickness, both surfaces of the detector contribute to carrier recombination. In photoconductive detector type semiconductive devices, the response time and low frequency ($1/f$) noise characteristics are dependent upon the surface state density and surface potential. That is, if the detector is of n-type conductivity, the surface can be made n+ by using a deposited layer having a positive charge density. Unless the accumulated surface charge and the low surface state density are maintained at their initial values, when subjected to high temperature storage, then the device characteristics will be unstable and the device will normally degrade. This high temperature degrading manifests itself as a decrease in response time and increased low frequency noise when these characteristics are measured on the photoconductive detector at 77°K.

Accordingly, it is an object of this invention to produce a photoconductive type semiconductor device having long term, high temperature stability.

Another object of this invention is to provide a photoconductive device having improved operating characteristics.

A further object of this invention is to provide a method of fabricating semiconductor detector devices which may be controlled to produce photoconductive devices having long term high temperature stability.

Still another object of this invention is to provide a method of fabricating semiconductor detector devices which provides for improved operating characteristics.

Yet another object of this invention is to provide a method of fabricating semiconductor detector devices which prepares and fixes the surface recombination velocity at a low value on both sides of the detector element.

Still another object of this invention is to produce a semiconductor detector having an accumulated surface, i.e., a surface having a surface charge density greater than that of the bulk.

Briefly state the embodiment of this invention comprises the anodization of a photoconductive semiconductor type material to stabilize the surface state density during sweepout. Sweepout is defined as the time it takes a hole to travel the distance between contacts, i.e., $T_{sweepout} = L/\mu_p E$ where $L$ = the distance between contacts, and $\mu_p E$ = drift velocity of hole. The method of anodization utilizes an electrolyte which permits anodization of the detector material to the required depth and which permits control to provide the uniformity of the anodic surface so necessary for obtaining reproducible electrical parameters.

Other objects and features of the embodiment of this invention will become readily apparent from the following description when considered in conjunction with the drawings in which:

FIGS. 1A–F show the fabrication steps for fabricating a semiconductor infrared detector device;

Figure 1A:

Referring now to the drawings and to FIGS. 1A–F wherein there is disclosed the steps of fabricating a detector device. A single crystal substrate 10 of photoconductive semiconductor material such as, for example, a n-type conductivity slice or slab of mercury cadmium telluride, or lead tin telluride, or lead tin antimonide, for an infrared detector is shown in FIG. 1A. A surface 12 of the detector slice 10 (FIG. 1A) is prepared for anodization by lapping in a lapper (not shown). A layer of molten-low-melting-point wax is formed on a center plug of a stainless steel lapping jig and the detector slice 10 together with surrounding chips is placed in the molten layer of wax. The molten wax when allowed to cool hardens to secure the slice 10 and surrounding chips to the center plug of the lapper. A disk of the lapper is then coated with a paste of alumina particles about 5 microns ($\mu$m) in diameter and the surface 12 lapped to remove any damage to the detector slice resulting from the sawing of the bar of the detector material into slices. The 5 $\mu$m alumina particles are then removed and the surface 12 lapped flat using a paste containing 3 $\mu$m alumina particles.

The additional chips are used to prevent rounding of the edges of the detector slice 10 during lapping.

Next, the lapped surface 12 is chemically polished with a methyl alcohol-1-percent bromine (methanol-bromine) etch to remove any damage owing to the mechanical lapping. After cleaning, the polished surface 12 of the detector slice 10 is ready for anodization.

Figure 2:
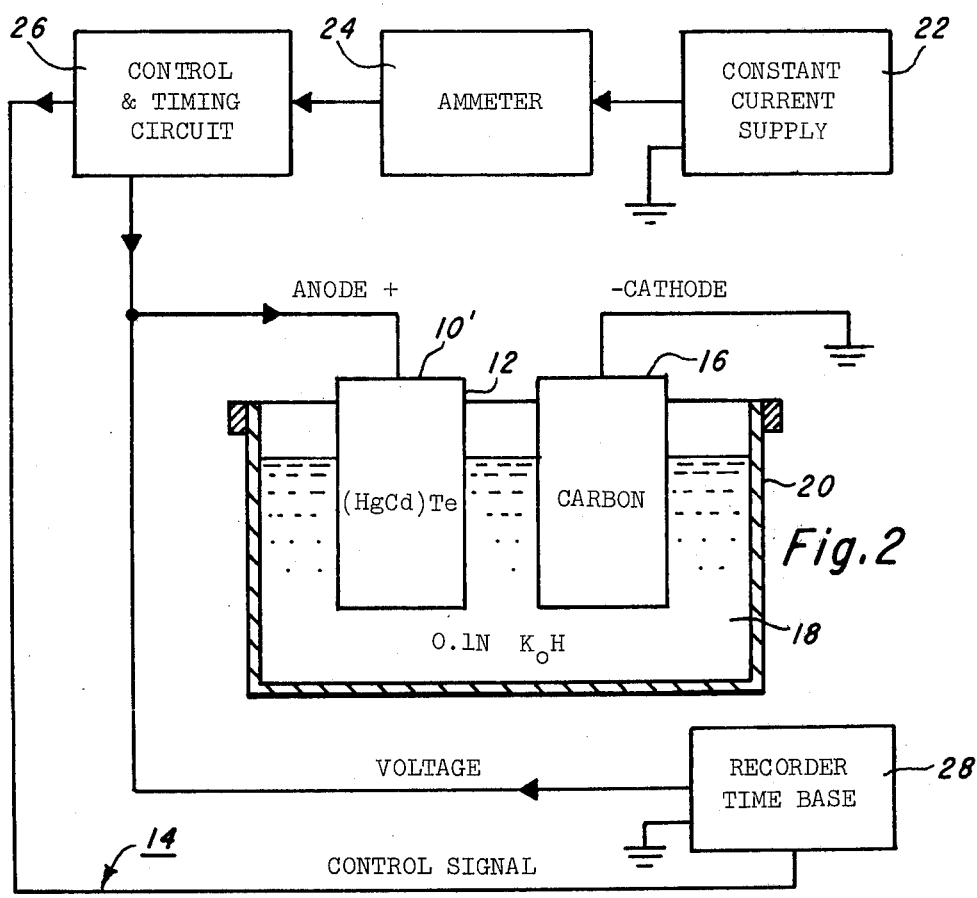
FIG. 2 is a block diagram of the anodization apparatus.

Anodization of the surface 12 of the slice 10 is done by electrolysis in an anodizing apparatus 14 such as that shown in FIG. 2 for example. The surface 12 of the slice 10 is made the anode 10' and a carbon rod is used as the cathode 16 of the anodizing apparatus. The anode 10' and the cathode 16 are placed in an electrolyte solution 18 which may be one of several solutions; e.g., a potassium hydroxide (KOH) aqueous solution of between 0.01 and 0.05 molarity, a 0.1 mole borax ($Na_2B_4O_7 \cdot 10H_2O$)-ethylene glycol solution; or a 0.1 mole KOH in a 90% ethylene glycol 10% water solution. The limitations of these solutions will be discussed hereinafter. The electrolyte solution is contained in a suitable tank 20 which may be a plastic lined stainless-steel tank.

Figure 1B:
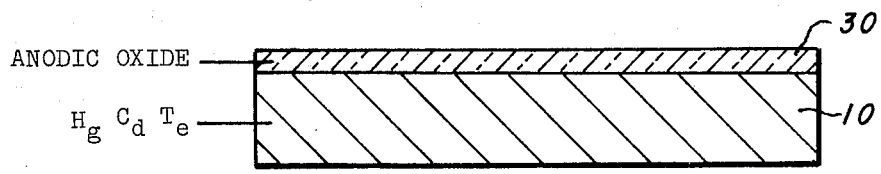
Figure 3:
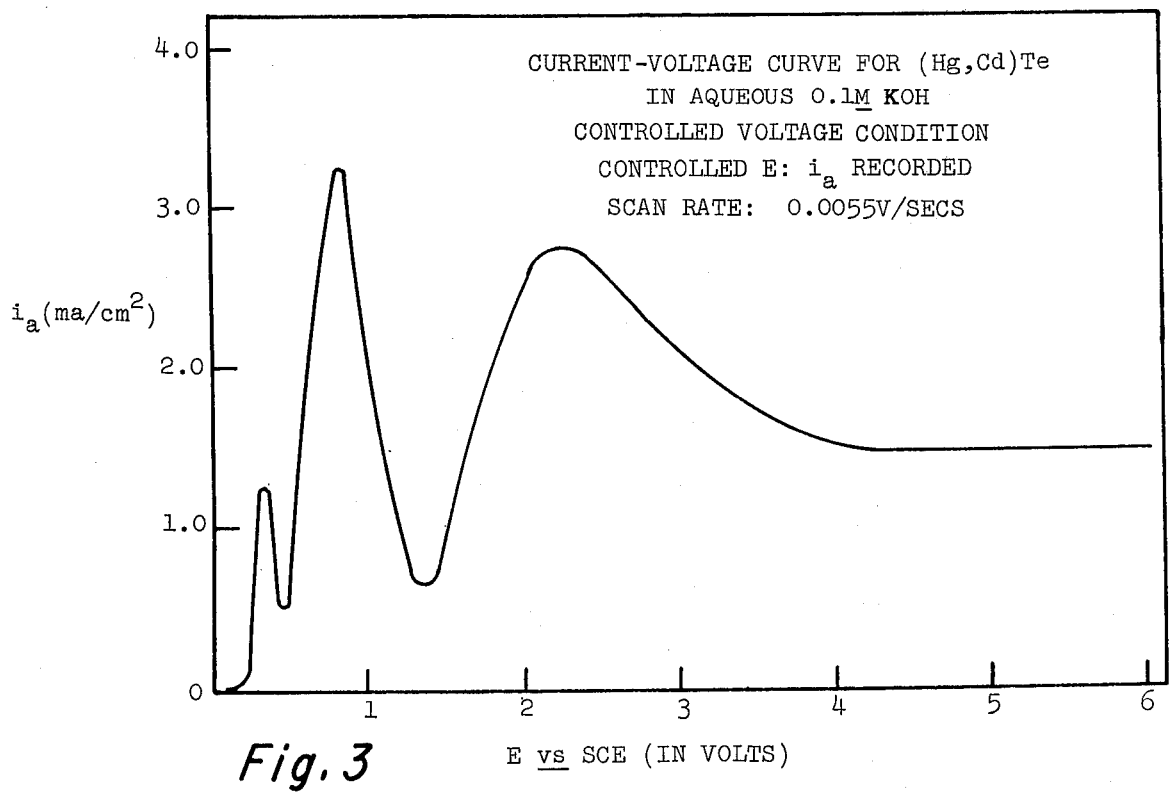
FIG. 3 is a current-voltage curve for (Hg,Cd)Te in aqueous 0.1 M KOH with the voltage controlled.
Figure 4:
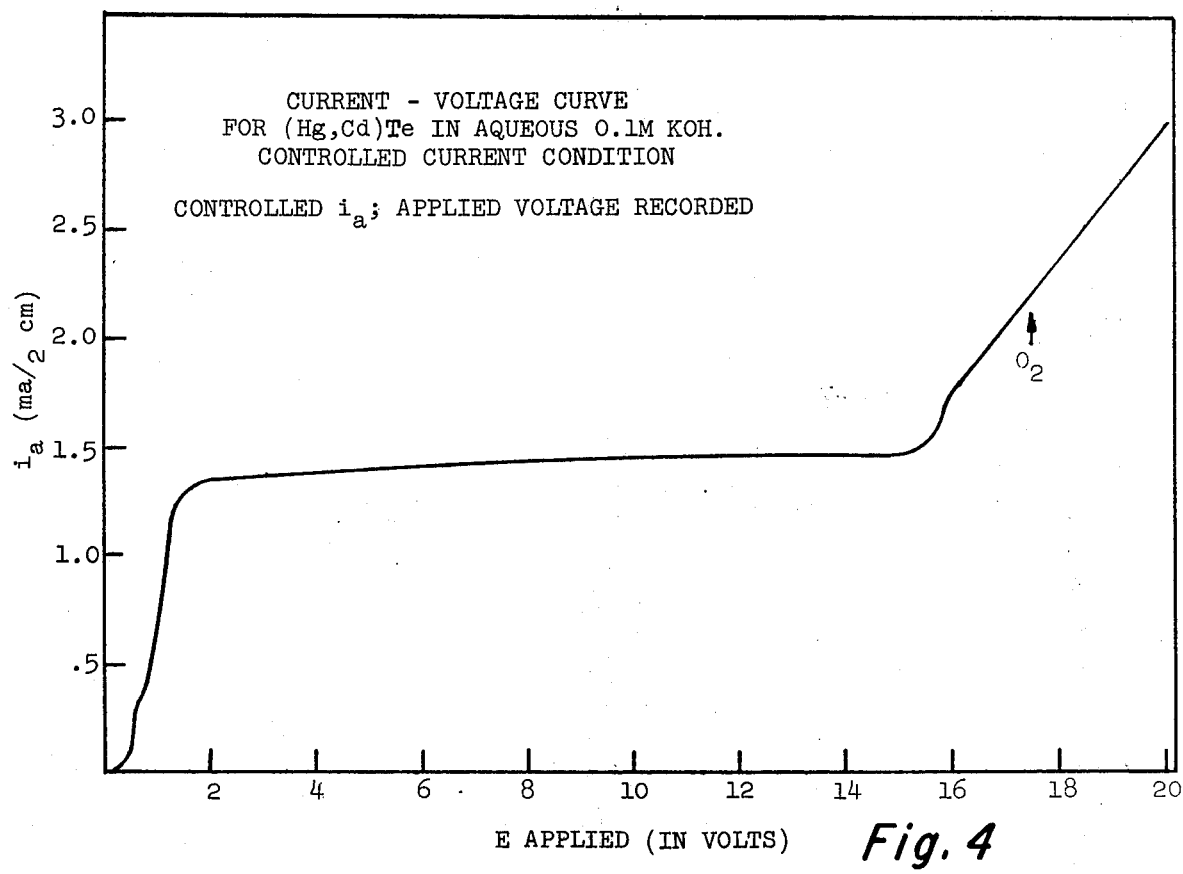
FIG. 4 is a current-voltage curve for (Hg,Cd)Te in aqueous 0.1 M KOH with the current controlled.

The apparatus 14 has a constant current supply source 22 for supplying a constant current of about 0.3 milliamperes (ma) through an ammeter 24 to a control and timing circuit 26. The timing and control circuit 26 has one output connected to the anode 10', and another output connected to a recorder 28 which records the current and anodization formation time. The timing and control circuit 26 automatically adjusts the voltage of the system to maintain the current constant during anodization of the surface 12 of the anode 10'. A constant current applied for a definite time produces the anodized surface having a desired uniform thickness. The electrolyte selected determines the thickness and quality of the anodized layer 30 (FIG. 1B). The current-voltage behavior of (Hg,Cd)Te, for example, in 0.1M KOH (aqueous solution) under controlled potential and controlled current conditions is shown in FIGS. 3 and 4, respectively. Under controlled potential conditions, three distinct electrochemical processes were recorded as the potential of the (Hg,Cd)Te electrode was swept from 0.0V to +6.0V versus the saturated calomel electrode (SCE). The curve obtained under the controlled current conditions is similar, but some of the definition for the respective processes is lost. Film formation was initiated in the region of the second anodic peak ( ≃ +0.7V vs. SCE) at a current density of ≃ 0.35 ma/cm². Between +2.5V and +15.0V (current density of ≃ 1.4 ma/cm²), the film formation occurs at its maximum rate. At higher voltages or current densities, oxygen was freed causing the film to become rough and non-uniform.

Figure 5:
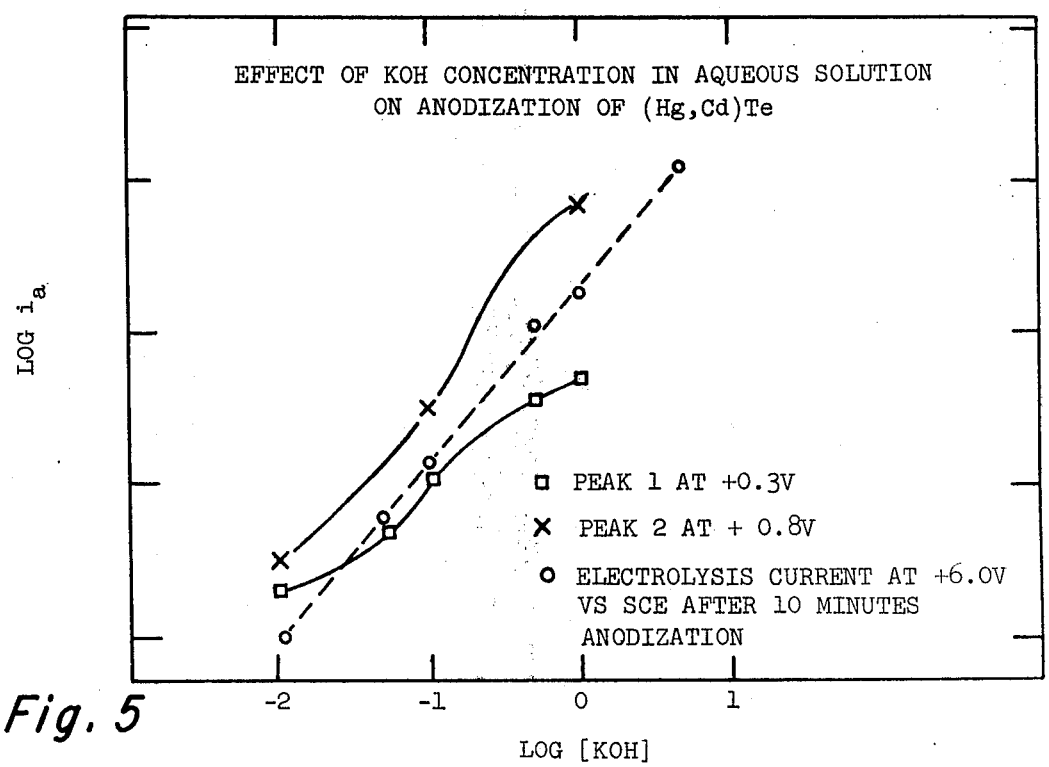
FIG. 5 is a graphic representation of the effect of KOH concentration in aqueous solution on anodization of (Hg,Cd)Te.

The effect of the KOH concentration on the peak currents for the anodic processes occurring at +0.3V and +0.8V versus the SCE and on the anodic current at +6.0V after 10 minutes anodization is shown graphically in FIG. 5. The currents of the anodic peaks increased with increasing KOH concentration indicating that the hydroxy radical (OH)⁻ is involved in the electrode processes. Although the 10 minute electrolysis at +6.0V was carried out in an unstirred solution which is subject to convection, the trend in the anodization current with increasing KOH concentration is apparent. The slope of a log-log plot for the anodization at +6.0V indicates that the electrolysis current is directly proportional to the KOH concentration ($i_a \propto C_{KOH}^{1.1}$).

Figures 6, 7:
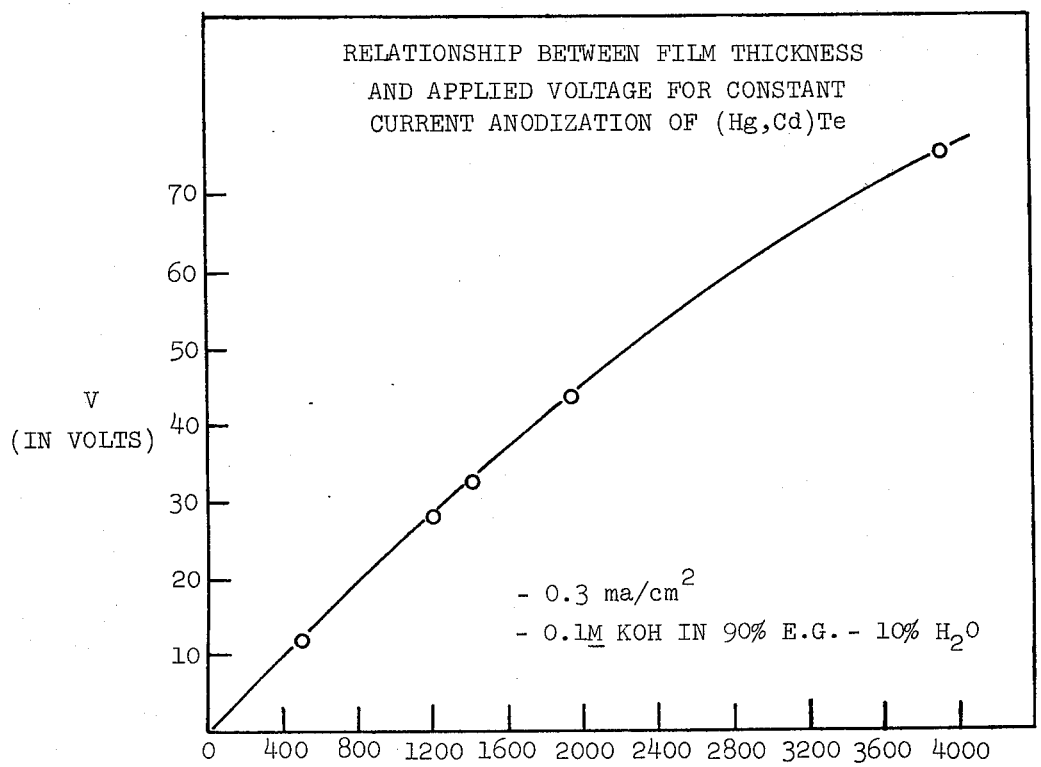
FIG. 6 is a color chart equating the thickness of an anodic oxide film to its color.
FIG. 7 shows the relationship between film thickness and applied voltage for constant current anodization.

At KOH concentrations greater than 0.1M the oxide films which form on the electrodes are dark and have a matte finish; at concentrations less than 0.1M, the films are shiny and reflect a color which is dependent on thickness (FIG. 6)

It is apparent from the effect of KOH concentration on the anodic currents and on the appearance of the films formed that the hydroxy radical (OH)⁻ is involved in a chemical reaction which follows the anodic oxidation of (Hg,Cd)Te; as the KOH concentration increases, the rate of dissolution of the film formed increases also allowing the anodization to occur at a more rapid rate. Therefore, for proper film formation through anodization, the anodizing solution must be alkaline enough to maintain a neutral to slightly alkaline condition at the electrode surface, but not so alkaline as to increase the dissolution rate of the film significantly.

The optimum KOH concentration for obtaining the thickest, most uniform films 30 (FIG. 1B) in aqueous solution is between 0.01M and 0.05M; using 0.01M KOH, the maximum thickness of the oxide film 30 attained before the film lost its color uniformity was ≃ 800A.

For thicker oxide films 30, i.e., 1,000A, without loss of color uniformity, borax ($Na_2B_4O_7 \cdot 10H_2O$) in ethylene glycol is used. Satisfactory results are obtained by using 0.1 mole of borax in 1 liter of ethylene glycol solution. Thicker films were grown in the 0.1M solutions, but the non-uniform color appearance of the films indicated undesirable variations in the growth rate across the surface area.

For growing oxide films 30 (FIG. 1B) up to a thickness of 4,000A, 0.1 mole of KOH is dissolved in 1 liter of 90% ethylene glycol 10% deionized water. The effect of KOH concentration follows the trend indicating that by increasing the KOH concentration the initial film growth rates are increased but the growth of the oxide film reaches a point where it inhibits the rate at which the electrochemical processes can proceed. In the 0.01M KOH solution, the hydroxy radical (OH)⁻ concentration at the electrode surface is apparently depleted allowing the dissolution of at least some of the oxidation products and, therefore, permitting a higher electrolysis current at the end of the 10 minutes anodization. With the 0.1M and 1.0M solutions, the oxide film formed inhibits the electode processes and, therefore, decreases current flow. Thus, the 0.1M KOH in 90% ethylene glycol - 10% deionized water is the preferred anodization electrolyte. FIG. 7 shows the relationship between the applied voltage to maintain a current density of 0.3 ma/cm² and the thickness of the oxide film grown in 0.1M KOH in 90% ethylene glycol - 10% deionized water. As the film grows, there is an increase in the voltage drop across the film due to its impedance. In addition there is an increased voltage drop across the solution caused by the electrical migration of the KOH electrolyte. The curve in FIG. 7 represents a composite of the effects of the film and of the solution, and has been found to be reproducible from one run to the next.

The films 30 grown by the use of the 0.1M KOH, 90% ethylene glycol - 10% deionized water electrolyte have been uniform in thickness and their colors also have been consistent. Thickness measurements were made on titanium over delineated oxide surfaces by using a Dektak (Tallysurf-type) instrument and optical interference techniques. A chart of oxide color versus thickness is shown in FIG. 6.

Thus, in the preferred embodiment, the substrate 10 of (Hg,Cd)Te photoconductive material is placed in the electrolyte of 0.1M KOH in 90% ethylene glycol - 10% deionized water and exposed to a constant current of 0.3 ma/cm², to a formation voltage of about 15 volts, for a time of 2 minutes. Oxide layers 30 in this manner were grown to a deep blue which was uniform throughout; this indicated a uniform thickness of 800A.

Figure 1C:
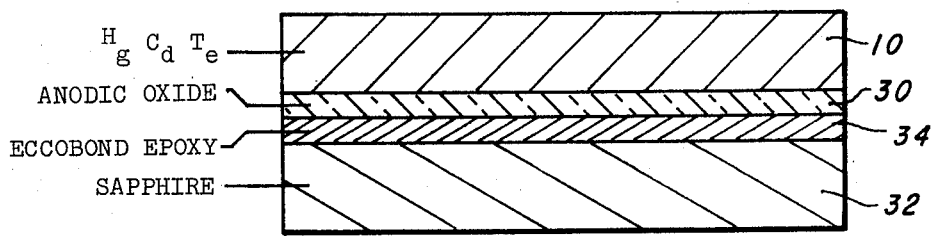

After anodization the slice 10 is cleaned by any suitable manner to remove surface contamination for mounting on a sapphire substrate 32 (FIG. 1C). A clean, flat surface is prepared on the sapphire and this surface together with the anodized surface of the slice 10 is treated by a silylation process to provide a base for a layered adhesive epoxy 34. An epoxy such as, for example, that sold by Emmerson and Cummings under the trademark Eccobond epoxy produces excellent results. After coating the silylated sapphire surface with epoxy, the detector slice 10 is mounted therein with the anodic oxide surface 30 face down. The structure is then heated at 60°C in a vacuum furnace until all bubbles disappear; then the epoxied substrate and material are allowed to cure.

Figure 1D:
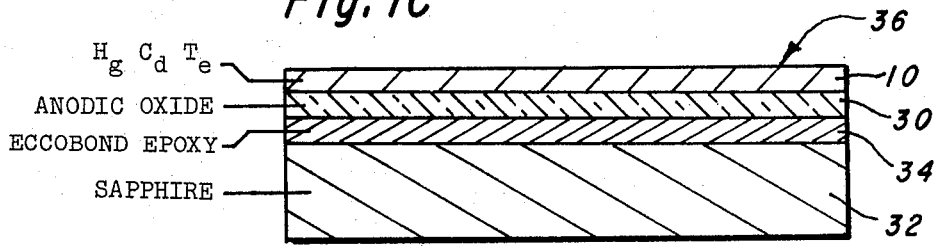

Next, the sapphire substrate 32 is mounted upon the lapping plug of the lapper with shims and is polished first with 5 μm alumina to about 0.003 inch, then with 3 μm alumina to about 40 to 50 μm, and then lapped chemically with 1-percent bromine in methanol solution to the final 10 μm thickness (FIG. 1D).

Figure 1E:
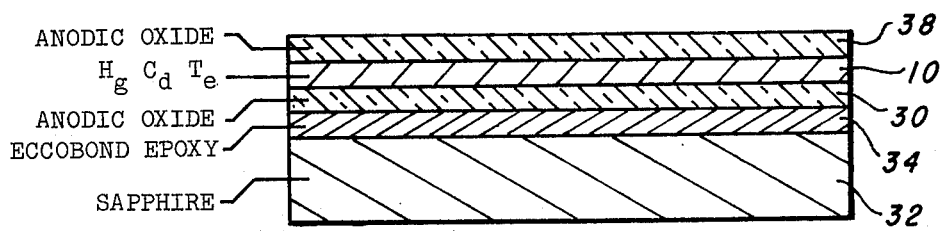
Figure 1F:
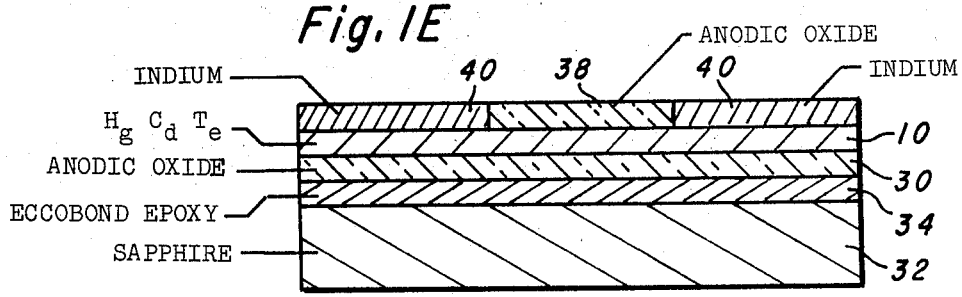

The structure is then removed from the lapping plug; and the lapped surface 36 of the detector slice 10 cleaned in isopropyl alcohol, dried with $N_2$ gas prior to anodization. The surface 36 of the detector slice 10 is then anodized in the electrolytic apparatus 14 using the 0.1 mole KOH in the 90% ethylene glycol - 10% deionized water electrolyte, in the manner previously described for anodizing the surface 12, to provide an anodic oxide surface 38 (FIG. 1E). The oxide layers 30 and 31 include dipoles which in the n-type semiconductor slab have the centers of the positive charges disposed interiorly. These positive charges repel the hole minority carriers to substantially reduce surface recombination and increase their lifetime and mobility.

Next, the anodic oxide surface 38 is coated with a layer of photoresist material such as, for example, that sold by Eastman Kodak under the trademark KT FR. After curing, a definition mask having the desired array pattern is placed over the photoresist which is now exposed to display the desired array pattern. The array is defined by spray etching with a bromine methanol solution. The remaining photoresist material is removed by spraying the device with trichloroethylene and the device is cleaned by spraying with isopropyl alcohol.

Metal contacts are formed on the array by using, for example, a positive photoresist rejection technique. The array surface is coated with the positive resist and openings 40 (FIG. 1F) are developed in the resist for the contact regions, using the metalization mask in the manner well known to those skilled in the art. The anodic oxide is removed from the contact regions with a buffered hydroflouric acid solution, after which the openings are rinsed with deionized water and dried in an oxygen free atmosphere such as nitrogen. A suitable contact metal such as indium is then vacuum-evaporated at a pressure not less than $10^{-6}$ torr in the openings 40 (FIG. 1F) to a thickness of about 1 μm. Excess metal is removed by placing the detector in acetone.

Array of detectors were fabricated in accordance with the method described and the detector arrays were characterized by measuring the following parameters:

| | |
|---|---|
| Detectivity (black body) | $D^*_{bb}$ (1,000; 1,500; 180°) |
| Responsivity in volts | Rv bb |
| Responsivity in amps | Ri bb |

All detector arrays, had measurable $D^*_{bb}$ and Rv; all arrays had average $D^*_{bb} > 1 \times 10^{10}$; Rv was greater than 50 KV/w; $1/f$ noise corner frequencies were in the range of 300–600 Hz; and surface recombination velocities in the range of 400–600 cm/sec.

Although several embodiments of the invention have been described, it will be apparent to the person skilled in the art that various modifications to details of construction shown and described may be made without departing from the scope of this invention.

What is claimed is:

1. A semiconductor infrared detector operative in the photoconductive mode comprising:
   a. a slab of junctionless semiconductor material having opposing major surfaces;
   b. an anodized surface formed on at least one of the opposing major surfaces of the slab of junctionless semiconductor material for repelling minority carriers to reduce substantially surface recombination of minority carriers formed by incident light impinging on the slab; and
   c. ohmic contacts affixed to the slab of junctionless semiconductor material in a spaced relationship one to the other whereby incident light falling on a major surface of the slab of junctionless semiconductor material generates carriers which recombine at the ohmic contacts to increase conductivity and gain.

2. A semiconductor infrared detector according to claim 1 wherein the slab of junctionless semiconductor material is of the n-type.

3. A semiconductor infrared detector according to claim 1 wherein the ohmic contacts are affixed adjacent to opposite ends.

4. A semiconductor infrared detector according to claim 1 wherein the slab of junctionless semiconductor material is (mercury, cadmium) telluride.

5. A semiconductor infrared detector operative in the photoconductive mode comprising:
   a. a slab of junctionless (mercury, cadmium) telluride having opposing major surfaces;
   b. anodized layers formed on the opposing major surfaces of the slab of (mercury, cadmium) telluride for repelling minority carriers generated by incident light impinging on a major surface of the slab to reduce substantially surface recombination; and
   c. ohmic contacts affixed to the slab of (mercury, cadmium) telluride semiconductor material in a spaced relationship one to the other whereby incident light falling on a major surface of the (mercury, cadmium) telluride slab generates carriers which recombine at the ohmic contacts to increase conductivity and gain.

6. A semiconductor infrared detector according to claim 5 wherein the slab of (mercury, cadmium) telluride is of n-type conductivity and the anodized surfaces include dipoles with the positive ends interiorly disposed to repel hole minority carriers from the surfaces for recombination at the ohmic contacts.

7. A semicondcutor infrared detector according to claim 5 further including a substrate to which one anodized major surface of the slab of (mercury, cadmium) telluride is affixed.

8. A semiconductor infrared detector according to claim 7 wherein the substrate is a sapphire substrate epoxy bonded to the slab of (mercury, cadmium) telluride.

9. A semiconductor infrared detector according to claim 5 wherein said ohmic contacts are indium contacts.

* * * * *